United States Patent
Belin

[19]

[11] Patent Number: 5,982,311
[45] Date of Patent: Nov. 9, 1999

[54] A/D CONVERSION DEVICE

[75] Inventor: Philippe Belin, Epron, France

[73] Assignee: U.S. Philips Corporation, New York, N.Y.

[21] Appl. No.: 08/956,816

[22] Filed: Oct. 23, 1997

[30] Foreign Application Priority Data

Oct. 25, 1996 [FR] France ................................ 96 13066

[51] Int. Cl.$^6$ ................................................. H03M 1/06
[52] U.S. Cl. .................................................... 341/118
[58] Field of Search .................... 341/118, 120; 348/697

[56] References Cited

U.S. PATENT DOCUMENTS

| | | | |
|---|---|---|---|
| 4,380,005 | 4/1983 | Debord et al. ........................ | 341/118 |
| 5,057,920 | 10/1991 | Wilkinson ............................ | 358/171 |
| 5,319,450 | 6/1994 | Tamayama et al. ................... | 358/692 |
| 5,371,552 | 12/1994 | Brummette et al. .................. | 348/697 |

FOREIGN PATENT DOCUMENTS

| | | |
|---|---|---|
| 0341326A1 | 11/1989 | European Pat. Off. . |
| 3744076A1 | 7/1989 | Germany . |
| 63267064 | 11/1988 | Japan . |

*Primary Examiner*—Michael Tokar
*Assistant Examiner*—Auh Tran
*Attorney, Agent, or Firm*—Steven R. Biren

[57] ABSTRACT

A conversion device includes an A/D converter (8) and a control module for auto-adjustment of the DC component. This module includes an analog comparator (5) which performs a comparison between the analog signal (11) at the input of the A/D converter (8) and a reference voltage (10) produced on the basis of voltages which feed the resistance ladder (9) of the converter. In order that the control does not introduce noise into the signal supplied, the comparator (5) of the control module has a non-linear response with a reduced output/input gain for a range of the differential control signal centered around zero.

10 Claims, 1 Drawing Sheet

A/D CONVERSION DEVICE

BACKGROUND OF THE INVENTION

The invention relates to an A/D conversion device having an analog input intended to receive an analog input voltage and a digital output intended to supply a digital signal resulting from the conversion of the analog input voltage, comprising an A/D converrer having an analog input, connected to the input of the device and moreover, via a storage capacitor, to a fixed DC potential source, and having an output constituting the output of the device, and a control module, provided with an analog comparator receiving a differential signal at the input, referred to as control signal and constituted by a first signal which is a signal having a predetermined fixed value and a second signal which is a signal representative of the input signal of the converter, said control module supplying a signal from its output allowing adjustment of the voltage at the terminals of the storage capacitor and being activated when the analog input voltage has a reference threshold.

Such a device is used, inter alia, in apparatuses for digitally processing images. The control module is used for auto-adjustment of the DC component in the signal supplied.

An A/D conversion device as described in the opening paragraph is known from U.S. Pat. No. 5,371,552. In the device described in this document, the control module comprises an analog comparator which performs a comparison between the analog signal at the input of the A/D converter and a reference voltage produced on the basis of voltages which feed the resistance ladder of this converter.

SUMMARY OF THE INVENTION

It is an object of the invention to improve the performance of such an A/D conversion device.

To this end, in a device according to the invention, the comparator of the control module has a non-linear response with a reduced output/input gain for a given range of the differential control signal, said range being centered around zero.

This has the advantage that the control of the DC component in the signal supplied does not introduce substantially any noise in this signal.

A digital system could be envisaged, with a digital comparator whose output value would be digitally multiplied by means of a variable number, or in which current sources of various values would be switched in order to obtain the equivalent of a reduced or an increased gain. Such a digital device would, however, risk the introduction of an instability in the A/D conversion because of control discontinuities.

Advantageously, the control module comprises means for generating, from the first and the second signal constituting the differential control signal, two differential signals which are DC-offset with respect to each other, one signal being referred to as the "high" signal and the other as the "low" signal, each signal being constituted by a first and a second signal respectively corresponding to the first and the second signal constituting the differential control signal, means for generating a control current as a function of the sum of two terms: on the one hand, the difference between the first signal constituting the high differential signal and the second signal constituting the low differential signal and, on the other hand, the difference between the second signal constituting the high differential signal and the first signal constituting the low differential signal, and a differential amplifier having a gain as a function of said control current for amplifying the differential control signal.

In an advantageous embodiment: the means for generating two offset differential signals comprise, for each of the first and second signals constituting the differential control signal, a first and a second stage of the "follower" type, each provided with a fractionated load, the first signal constituting the high differential signal and the first signal constituting the low differential signal being taken from the terminals of a fraction of the load of the first follower stage, the second signal constituting the high differential signal and the second signal constituting the low differential signal being taken from the terminals of a fraction of the load of the second follower stage, the means for generating the control current comprise two differential pairs of transistors each provided with a first and a second transistor, the base of the first transistor of the first pair receiving the first signal constituting the high differential signal and that of the second transistor receiving the second signal constituting the low differential signal, the base of the first transistor of the second pair receiving the second signal constituting the high differential signal and that of the second transistor receiving the first signal constituting the low differential signal, the collector currents of the first/second transistors of the two pairs being added together, the differential amplifier comprises a differential pair of transistors, whose inputs receive the differential control signal, in which pair the interconnected emitters of the two transistors receive said control current, possibly reproduced by means of current mirrors, and the two transistors of the differential pair are each charged by a load transistor, the two load transistors jointly constituting a current mirror such that the differential amplifier has a current output, and a plate of the storage capacitor is connected to this current output.

In a particular embodiment, the analog input of the A/D converter is connected via a capacitance to the analog input of the device and via a resistor to a reference input intended to receive a reference voltage, and a second differential amplifier is arranged between the analog input of the A/D converter and the analog input of the device, said amplifier having a first input which is connected to the input of the device and a second input which is connected to a power supply terminal via the storage capacitor, and an output connected to the input of the A/D converter.

With the A/D converter being provided with a resistor ladder which is subject to a given potential difference and supplies, at each junction point between two resistors, a ladder reference voltage used by the converter at the ends of the comparison with a signal received at its analog input, the control signal is preferably processed on the basis of at least one of said ladder reference voltages, for example, one of the signals constituting the control signal is one of the ladder reference voltages.

These and other aspects of the invention are apparent from and will be elucidated with reference to the embodiments described hereinafter.

DESCRIPTION OF THE PREFERRED EMBODIMENTS

Figure 1:
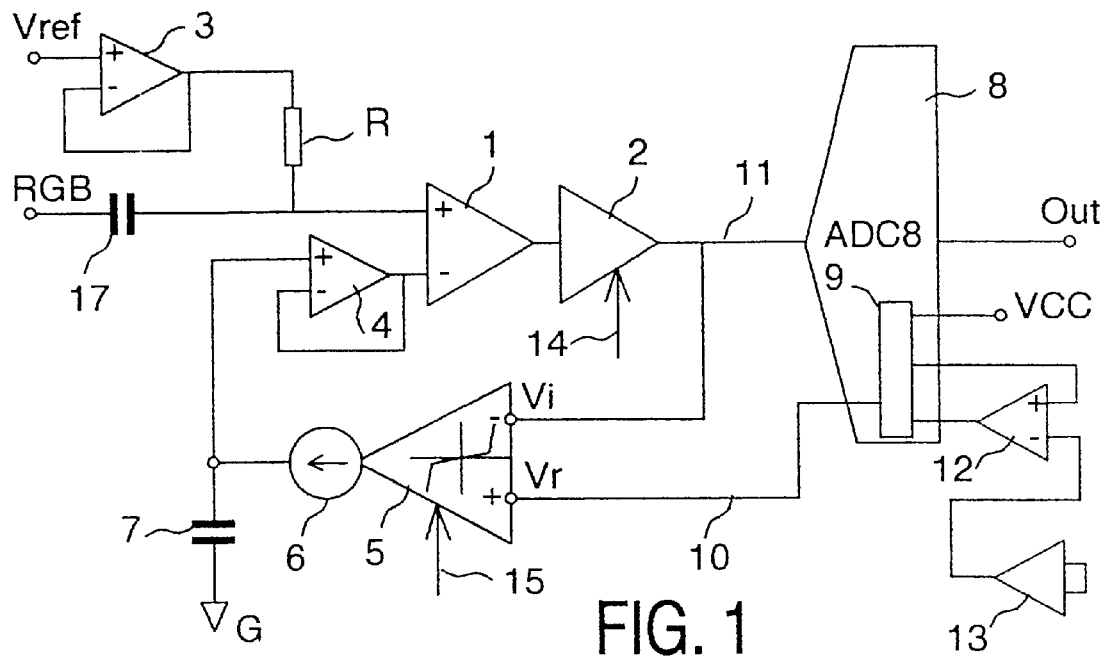
FIG. 1 shows diagrammatically an A/D conversion device intended for television applications.

The A/D conversion device shown in FIG. 1 has an analog input indicated by the reference "RGB", intended to receive an analog input voltage. It is, for example one of the color components of an image in a television receiver or in a computer monitor. For this type of application, the frequencies of the signals may reach several megahertz and the precision of an eight-bit converter is satisfactory. It is important that the level of the DC component, referred to as black level, is well-controlled. The converter according to the invention allows such a control without producing any troublesome noise.

The device has a digital output indicated by the reference "Out", intended to supply a digital signal resulting from the conversion of the analog input voltage.

The input "RGB" of the device is connected to the analog input 11 of an A/D converter 8. This connection is established in this case via a coupling capacitor 17 and via an amplifier 1 whose branching will hereinafter be explained in greater detail. The output of the converter 8 constitutes the output (Out) of the device.

The amplifier 1 is of the differential type having two inputs. The input RGB of the device is connected to its "+" input via the capacitor 17. An input Vref intended to receive a reference voltage is also connected to this "+" input via an impedance matching amplifier 3 and a resistor R. The "−" input is connected via a storage capacitor 7 to a fixed DC potential source, here ground. The output of the amplifier 1 is connected to the input of the A/D converter 8 via another amplifier 2. This amplifier 2, which does not form part of the invention, is a type having a gain which can be controlled by a gain control input 14 and allows calibration of the device.

A control module is used for adjusting the black level. It is essentially constituted by the elements 5–6. A comparator 5 receives a differential control signal at its input Vr|Vi. This signal is constituted by a first signal applied to the input Vi, and a second signal applied to the input Vr. The first signal 11, applied to the input Vi, is a signal which is representative of the input signal of the A/D converter 8. Here, it is simply the signal itself. The second signal 10, applied to the input Vr, is a signal having a predetermined value. At the exact instant, when the analog input voltage is given a reference threshold, the comparator is activated by means of an input 15 connected to a known circuit which is not shown and does not form part of the invention. The comparator supplies a signal at the output, which signal controls the current of a current generator 6 whose current is applied to the storage capacitor 7 for charging or discharging this capacitor. The control module thus allows adjustment of the voltage at the terminals of this capacitor.

An amplifier 4 in a follower configuration is arranged between the capacitor 7 and the input of the amplifier 1 which enables the current consumed to be rendered very small and to avoid a drift of the voltage at the terminals of the capacitor 7.

The A/D converter 8 is provided with a resistor ladder 9 supplying, to each junction point between two resistors, a ladder reference voltage used by the converter at the ends of comparison with the signal received at its analog input. The ladder is branched between a power supply voltage VCC and the output of an amplifier 12 having two inputs, arranged in known manner, with its "+" input connected to a junction point of the ladder 9 and its "−" input connected at the output of an amplifier 13 whose two inputs are interconnected. The amplifier 13 is a copy of the amplifier 1 and has for its object to reproduce the parasitic offset voltage of the latter, having then a compensation effect. The control signal is processed on the basis of one of said ladder reference voltages: the signal 10 constituting the control signal is taken from a junction point of the ladder 9. Here, it is thus one of the ladder reference voltages of this ladder, for example the one to correspond to the black level in the signal 11.

As indicated in the Figure within the triangle showing the comparator 5, the latter has a non-linear response with a reduced output/input gain for a range of the differential control signal centered around zero.

Figure 2:
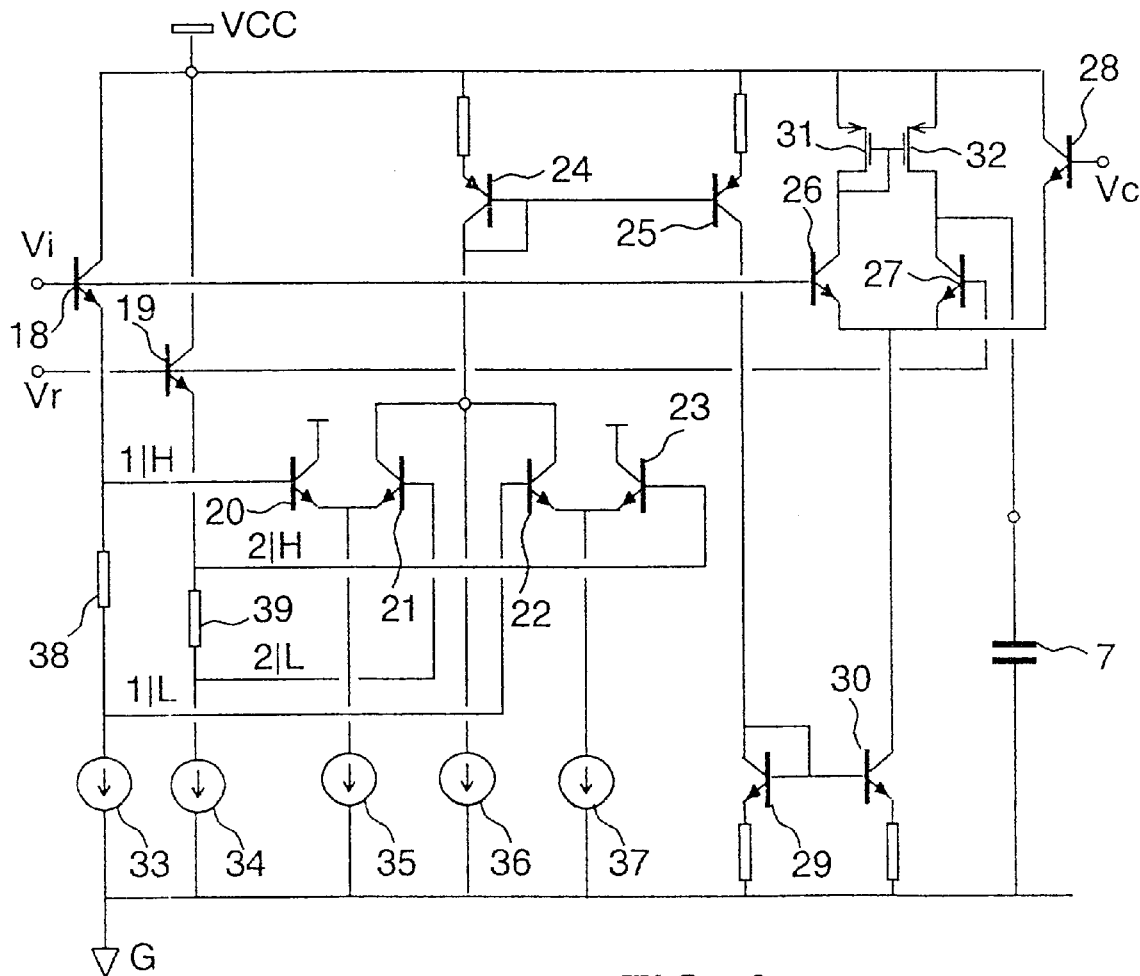
FIG. 2 shows in greater detail a control module realized in an integrated form.

The control module is shown in FIG. 2. A first signal and a second signal which jointly constitute the differential control signal are applied to the input Vi and the input Vr, respectively. Two differential signals which are DC offset with respect to each other are generated from the two inputs Vi and Vr. One signal will be referred to as the "high" signal and the other as the "low" signal, each being constituted by a first and a second signal corresponding to the first signal Vi and the second signal Vr, respectively. An input of a first stage and an input of a second stage constituted by the transistors 18 and 19 arranged as emitter followers is connected to each of the inputs Vi and Vr, respectively. Each of these transistors has a fractionated load constituted by a resistor 38, 39 in series with a current generator 33, 34, respectively. The first signal constituting the "high" differential signal, 1|H, and the first signal constituting the "low" differential signal, 1|L, are taken from the high terminal and the low terminal, respectively, of the resistor 38, which is a fraction of the load of the first follower stage. The second signal constituting the "high" differential signal, 2|H, and the second signal constituting the "low" differential signal, 2|L, are taken from the high and the low terminal, respectively, of the resistor 39, which is a fraction of the load of the second follower stage. The resistors 38 or 39 may also be replaced by other loading types such as transistors arranged in a diode configuration.

Two differential pairs are each provided with a first transistor, 20 and 23, and a second transistor, 21 and 22, respectively. The base of the first transistor 20 of the first pair receives the first high signal 1|H and that of the second transistor 21 receives the second low signal 2|L, the base of the first transistor 23 of the second pair receives the second high signal 2|H and that of the second transistor 22 receives the first low signal 1|L.

The collectors of the second transistors 21, 22 of the two pairs are jointly connected to a current mirror which comprises a current generator transistor 25 and a transistor 24 arranged in a diode configuration with its anode connected to the power supply terminal VCC and the cathode connected to ground via a current source 36. It passes a current through the diode 24 which is composed of the current from the source 36 to which possibly a supplementary current from the transistor 21 or 22 may be added. The current of the transistor 25 is "returned" in a current mirror constituted by the transistors 29 and 30.

The supplementary current described above is a function of the sum of two terms:
   on the one hand, the difference between the first high signal 1|H, which is a constituent of the high differential signal, and the second low signal 2|L which is a constituent of the low differential signal,
   on the other hand, the difference between the second high signal 2|H, which is a constituent of the high-differential signal, and the first low signal 1|L, which is a constituent of the low differential signal.

If the signals applied to the inputs Vi and Vr were inverted, the collectors of the first transistors 20, 23 of each pair would have to be connected to the transistor 24.

A differential amplifier for amplifying the control signal is constituted by the transistors 26 and 27. Its gain is a function of the current supplied to its emitters. This current, referred to as control current, is the current reproduced by the current mirrors 24, 25 and 29, 30. The output of the amplifier 26, 27 is realized in known manner by a current mirror consisting of two MOS-FET transistors 31, 32 whose drain-source paths are inserted between the collectors of the transistors 26 and 27 and the power supply VCC. The current thus supplied enables the capacitor 7 (same as in FIG. 1) to be charged or discharged. A transistor 28 having its base connected to an enable control terminal Vc is branched between VCC and the emitters of the transistors 26, 27. It allows a current to be derived for disabling the circuit and the input Vc corresponds to the control 15 in FIG. 1.

The operation will be illustrated by supposing, for example, that the voltage offset at the terminals of the resistor 38 or the resistor 39 is 0.6 volt, in three particular cases, on the basis of which it is evident to interpolate:

1) First, it will be supposed that Vi=Vr. The signals 1|H and 2|H have the same value, for example 2 volts, and the signals 1|L or 2|L also have the same value, offset by −0.6 volt, i.e. 1.4 volt. The voltages applied to the bases of the transistors 20, 21, 22, 23 are 2, 1.4, 1.4 and 2 volts, respectively. The transistors 20 and 23 are turned on, the transistors 21 and 22 are turned off. The current in the mirror 24, 25 is only the current from the source 36.

2) Then it will be supposed that 1|H has the value of 2.3 volts and 2|H has the value of 1.7 volts, i.e. roughly lower by a base-emitter voltage. With always an offset of −0.6 volt in the resistor 38 or 39, the signal 1|L has the value of 1.7 volts and the signal 2|L has the value of 1.1 volts, while the voltages applied to the bases of the transistors 20 and 21 have values of 2.3 volts (1|H) and 1.1 volts (2|L), respectively, and the whole current flows through the transistor 20. The voltages applied to the bases of the transistors 22 and 23 have values of 1.7 volts (1|L) and 1.7 volts (2|H), respectively, the current from the source 37 splits evenly between the transistors 22 and 23 and a current is added to the current from the source 36 in the mirror 24, 25.

3) For inverse values, i.e. 1|H having a value of 1.7 volts and 2|H having a value of 2.3 volts, the current from the source 35 splits up between the transistors 20 and 21 and a current is added again to the current from the source 36.

Thus it appears that, for a range of the differential control signal centered around zero, i.e. for Vi proximating Vr, the current in the pair of transistors 26, 27 is the current from the source 36, copied by the mirrors. When the differential control signal moves away from zero, i.e. when Vi moves away from Vr, in one or the other direction, a current flowing through the transistor 21 or through the transistor 22 in accordance with the direction of the difference between Vi and Vr, will be added to the current in the pair of transistors 26, 27 and this pair therefore has a larger gain. With such a circuit, the change of the slope of the curve representing the gain of the differential amplifier 5 is generated progressively in a voltage range of approximately 15 mV of the control signal.

Variants are possible while preserving the benefits of the invention, i.e. the fact that the comparator is non-linear. The matching impedance 3 is not indispensable: the resistor R may be directly connected to a power supply voltage. The presence of the amplifier 4 or 2 is neither indispensable for the invention. Moreover, in another circuit referred to as clamp series circuit, the storage capacitor is arranged in series in the connection between the input RGB and the input of the amplifier 2 (there is no amplifier 1). In this case, the output of the control module is connected to the common point between the storage capacitor and the input of the amplifier 2. The module must then act inversely.

What is claimed is:

1. An A/D conversion device having an analog input intended to receive an analog input voltage and a digital output intended to supply a digital signal resulting from the conversion of the analog input voltage, comprising:

an A/D converter having an analog input connected to the input of the device and moreover, via a storage capacitor, to a fixed DC potential source, and having an output constituting the output of the device, and a control module, provided with an analog comparator receiving a differential signal at the input, referred to as control signal and constituted by a first signal which is a signal having a predetermined fixed value and a second signal which is a signal representative of the input signal of the converter, said control module supplying a signal from its output allowing adjustment of the voltage at the terminals of the storage capacitor when the analog input voltage has reached a reference threshold voltage, characterized in that the comparator of the control module has a non-linear response with a reduced output/input gain for a given range of the differential control signal, said range being centered around zero.

2. An A/D conversion device as claimed in claim 1, characterized in that the control module comprises means for generating, from the first and the second signal constituting the differential control signal, two differential signals which are DC-offset with respect to each other, one signal being referred to as the "high" signal and the other as the "low" signal, each of them being constituted by a first and a second signal respectively corresponding to the first and the second signal constituting the differential control signal, means for generating a control current as a function of the sum of two terms: the difference between the first signal constituting the high differential signal and the second signal constituting the low differential signal and, the difference between the second signal constituting the high differential signal and the first signal constituting the low differential signal, and a differential amplifier having a gain as a function of said control current for amplifying the differential control signal.

3. An A/D conversion device as claimed in claim 2, characterized in that the means for generating two offset differential signals comprise, for each of the first and second signals constituting the differential control signal, a first and a second stage of the "follower" type, each provided with a fractionated load, the first signal constituting the high differential signal and the first signal constituting the low differential signal being taken from the terminals of a fraction of the load of the first follower stage, the second signal constituting the high differential signal and the second signal constituting the low differential signal being taken from the terminals of a fraction of the load of the second follower stage.

4. An A/D conversion device as claimed in claim 2, characterized in that the means for generating the control current comprise two differential pairs of transistors each provided with a first and a second transistor, the base of the first transistor of the first pair receiving the first signal constituting the high differential signal and that of the second transistor receiving the second signal constituting the low differential signal, the base of the first transistor of the second pair receiving the second signal constituting the high differential signal and that of the second transistor receiving the first signal constituting the low differential signal, the collector currents of the first/second transistors of the two pairs being added together.

5. An A/D conversion device as claimed in claim 2, characterized in that the differential amplifier comprises a differential pair of transistors, whose inputs receive the differential control signal, in which pair the interconnected emitters of the two transistors receive said control current, possibly reproduced by means of current mirrors.

6. An A/D conversion device as claimed in claim 5, characterized in that the two transistors of the differential pair are each charged by a load transistor, the two load transistors jointly constituting a current mirror such that the differential amplifier has a current output, and a plate of the storage capacitor is connected to this current output.

7. An A/D conversion device as claimed in claim 1, characterized in that the analog input of the A/D converter is connected via a capacitance to the analog input of the device and via a resistor to a reference input intended to receive a reference voltage.

8. An A/D conversion device as claimed in claim 1, characterized in that a second differential amplifier is arranged between the analog input of the A/D converter and the analog input of the device, said amplifier having a first input which is connected to the input of the device and a second input which is connected to a power supply terminal via the storage capacitor, and an output connected to the input of the A/D converter.

9. An A/D conversion device as claimed in claim 1, characterized in that, the A/D converter is provided with a resistor ladder which is subject to a given potential difference and supplies, at each junction point between two resistors, a ladder reference voltage used by the converter at the ends of the comparison with a signal received at its analog input, the control signal is processed on the basis of at least one of said ladder reference voltages.

10. An A/D conversion device as claimed in claim 9, characterized in that one of the signals constituting the control signal is one of the ladder reference voltages.

\* \* \* \* \*